(12) United States Patent
Satou et al.

(10) Patent No.: US 10,349,556 B2
(45) Date of Patent: Jul. 9, 2019

(54) COOLING DEVICE AND ELECTRONIC DEVICE USING SAME

(71) Applicant: Panasonic Intellectual Property Management Co., Ltd., Osaka (JP)

(72) Inventors: Kaoru Satou, Aichi (JP); Ayaka Suzuki, Aichi (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/770,173

(22) PCT Filed: Aug. 29, 2017

(86) PCT No.: PCT/JP2017/030826
§ 371 (c)(1),
(2) Date: Apr. 20, 2018

(87) PCT Pub. No.: WO2018/043442
PCT Pub. Date: Mar. 8, 2018

(65) Prior Publication Data
US 2018/0255663 A1    Sep. 6, 2018

(30) Foreign Application Priority Data

Aug. 30, 2016 (JP) .................. 2016-167445
Dec. 27, 2016 (JP) .................. 2016-252209

(51) Int. Cl.
*F28F 7/00* (2006.01)
*H05K 7/20* (2006.01)
(Continued)

(52) U.S. Cl.
CPC ..... *H05K 7/20327* (2013.01); *F28D 15/0266* (2013.01); *H01L 23/427* (2013.01)

(58) Field of Classification Search
CPC .... H05K 7/20327; H05K 7/20; H01L 23/473; F28D 15/02
(Continued)

(56) References Cited

U.S. PATENT DOCUMENTS 8,235,096 B1 * 8/2012 Mahefkey ............. F28D 15/046
165/104.26
2004/0069459 A1   4/2004 Tonosaki et al.
(Continued)

FOREIGN PATENT DOCUMENTS

JP    61-041888    2/1986
JP    2004-088048  3/2004
(Continued)

OTHER PUBLICATIONS

International Search Report of PCT application No. PCT/JP2017/030826 dated Nov. 28, 2017.
(Continued)

*Primary Examiner* — Claire E Rojohn, III
(74) *Attorney, Agent, or Firm* — Wenderoth, Lind & Ponack, L.L.P.

(57) ABSTRACT

A cooling device includes: a heat receiver configured to transfer heat from a heat generation body to a refrigerant, a heat radiator that is connected to the heat receiver via a heat radiation path, and a return path that connects the heat radiator and the heat receiver with each other, in which the refrigerant is to circulate in order of the heat receiver, the heat radiation path, the heat radiator, and the return path and cause a gas-liquid two-phase change and cool the heat generation body, and in which the heat receiver includes a heat receiving plate which is in contact with the heat generation body and is configured to absorb the heat, and a heat receiving cover which covers a surface of the heat receiving plate and defines a heat receiving space.

6 Claims, 8 Drawing Sheets

(51) Int. Cl.
*F28D 15/02* (2006.01)
*H01L 23/427* (2006.01)

(58) Field of Classification Search
USPC ........................................... 165/80.4
See application file for complete search history.

(56) References Cited

U.S. PATENT DOCUMENTS

| | | | | |
|---|---|---|---|---|
| 2006/0157227 | A1* | 7/2006 | Choi | B82Y 30/00 165/104.21 |
| 2009/0084525 | A1* | 4/2009 | Satou | F28D 15/0266 165/104.21 |
| 2010/0252237 | A1* | 10/2010 | Hashimoto | F28D 15/046 165/104.21 |
| 2011/0017431 | A1* | 1/2011 | Yang | F28D 15/046 165/104.26 |
| 2013/0063896 | A1 | 3/2013 | Satou et al. | |
| 2013/0327504 | A1* | 12/2013 | Bozorgi | F28D 15/04 165/104.26 |

FOREIGN PATENT DOCUMENTS

| | | |
|---|---|---|
| JP | 2006-526128 | 11/2006 |
| JP | 2009-088127 | 4/2009 |
| JP | 2012-189260 | 10/2012 |
| JP | 2014-074568 | 4/2014 |
| JP | 2015-059683 | 3/2015 |
| JP | 2015-065187 | 4/2015 |

OTHER PUBLICATIONS

Shohei Umemoto et al., "Passive two-phase cooling using super-hydrophilic boiling surface and refrigerants for electronic devices", Proceedings of the 53rd Transmission Symposium (May 2016), C 134.

* cited by examiner

COOLING DEVICE AND ELECTRONIC DEVICE USING SAME

TECHNICAL FIELD

The present invention relates to a cooling device and an electronic device using the same.

BACKGROUND ART

For example, in servers, electronic elements such as CPUs are accompanied by extremely large heat generation as the processing capability of the server is improved (high-speed processing). Therefore, a cooling device for cooling the electronic element is indispensable for securing the operation stability of the whole system.

For example, a cooling device for cooling an electronic device such as a server has been configured as follows until now.

In other words, the cooling device includes a heat receiver, a heat radiator connected to a discharge port of the heat receiver via a heat radiation path, and a return path connecting the heat radiator and an inflow port of the heat receiver with each other. The heat receiver includes a heat receiving plate which is in contact with the heat generation body to absorb heat and a heat receiving cover which covers the surface of the heat receiving plate and forms a heat receiving space for evaporating the refrigerant flowing on the surface. In addition, in the heat receiving space, the heat receiving plate includes a refrigerant inflow portion near a center thereof and a vaporizer in which radial groove portions are provided toward an outer periphery of the refrigerant inflow portion, and an introduction pipe is configured to be disposed in a direction substantially perpendicular to the heat receiving plate (see, for example, Japanese Patent Unexamined Publication No. 2009-88127).

In the cooling device of Japanese Patent Unexamined Publication No. 2009-88127, there is a case where the cooling performance is reduced in a case where a heat generation amount of the electronic element that generates heat by being in contact with the heat receiver is small.

In other words, in the cooling device of the example of the related art, a portion of the refrigerant flowing into the refrigerant inflow portion from the introduction pipe receives heat from the heat receiving plate and boils and vaporizes. At this time, the boiled and vaporized refrigerant diffuses as a high-speed mixed phase flow (gas phase and liquid-phase) on the heat receiving plate together with the unboiled liquid-phase refrigerant due to rapid volume expansion. At this time, the unboiled liquid-phase refrigerant also spreads in the form of a thin film on the entire surface of the heat receiving plate. Then, by continuous heating from a heat generation body, the unboiled liquid-phase refrigerant is instantaneously heated and vaporized, thereby efficiently removing vaporization heat from the entire heat receiving plate and cooling the heat receiving plate.

However, although the cooling device of the related art shows very good performance in a case where the heat receiver receives a large heat amount from the electronic element, in a case where the heat amount is small, as described above, an evaporation amount of the initial boiling of the refrigerant generated on the heat receiving plate near the tip of the introduction pipe in the heat receiver is also reduced, and thus the cooling performance is reduced. This is due to the fact that the refrigerant cannot obtain a sufficient volume expansion rate because the evaporation amount of the refrigerant is reduced. In other words, since the speed of volume expansion of the refrigerant is slow, a film thickness of the liquid-phase refrigerant formed on the heat receiving plate cannot be reduced, resulting in a decrease in cooling performance. This reduction in the evaporation amount of the refrigerant is due to a significant decrease in a bubbles generation amount from the refrigerant due to the low heat generation amount of the electronic element. Therefore, in a case where the heat generation amount of the electronic element is large, although the superiority of the cooling device of other type (air cooling, water cooling, or the like) is large, in a case where the heat generation amount of the electronic element is small, the temperature rise of the heat receiver relatively decreases and the superiority over the cooling method of another type is greatly diminished.

Therefore, it is proposed that a hydrophilic surface treatment film is formed on the surface of the heat receiving plate by a laser processing method described in Shohei Umemoto et al. "Passive two-phase cooling using super-hydrophilic boiling surface and refrigerants for electronic devices", Proceedings of the 53rd Transmission Symposium (2016-5), C 134as one means of generating a lot of bubbles from the refrigerant even in a case where the heat generation amount of the electronic element is small. By forming a hydrophilic surface treatment film on the surface of the heat receiving plate, even in a case where the heat generation amount of the electronic element is small, generation of bubbles from the refrigerant is promoted, and as a result, since the evaporation amount of the refrigerant is increased, it is reported that efficient cooling is possible.

However, the hydrophilic surface treatment film formed on the surface of this heat receiving plate is a very thin film. In addition, there is a case where fine foreign matters may be mixed in the refrigerant or the device. Therefore, there is a high possibility that the surface treatment film is physically damaged by fine foreign matters flowing together with a high-speed refrigerant flow generated on the film surface when the refrigerant is boiled. Therefore, in order to achieve improvement of both cooling performance of the cooling device and long-term operation stability, securing long-term durability of the film has been a problem.

SUMMARY OF THE INVENTION

Therefore, the object of the present invention is to prevent damage of the surface treatment film of the heat receiving plate, to improve the cooling performance of the cooling device, and to secure the operational stability.

In order to achieve this object, according to the present invention, there is provided a cooling device including: a heat receiver that transfers heat from a heat generation body to a refrigerant, a heat radiator that is connected to the heat receiver via a heat radiation path, and a return path that connects the heat radiator and the heat receiver with each other, in which the refrigerant circulates in order of the heat receiver, the heat radiation path, the heat radiator, and the return path while causing a gas-liquid two-phase change and cools the heat generation body, and in which the heat receiver includes a heat receiving plate which is in contact with the heat generation body and absorbs the heat, and a heat receiving cover which covers a surface of the heat receiving plate and forms a heat receiving space. A check valve that opens in a case where pressure of the return path is larger than pressure in the heat receiving space is provided between the return path and the heat receiver and a hydrophilic surface treatment film is formed on a recessed portion of a surface of the heat receiving plate and thus the intended purpose is achieved.

According to the present invention, damage of the surface treatment film of the heat receiving plate can be prevented and the cooling performance of the cooling device can be improved at the time of a low heat generation amount and the operation stability can be secured.

In other words, in the present invention, by forming a hydrophilic surface treatment film in the recessed portions provided in the surface of the heat receiving plate, the bubble generation from the working fluid dropped onto the heat receiving plate is promoted and as a result, the evaporation amount of the working fluid increases. Therefore, in the cooling device according to the present invention, since the boiling of the working fluid is efficiently performed even at a low heat generation amount, a high cooling effect is obtained. In addition, the mixed phase flow, which is a working fluid flowing at high-speed, is unlikely to directly hit the surface treatment film in the recessed portion, and it can be prevented from being damaged by the collision of foreign matter mixed in the working fluid. As a result, the cooling performance at the time of a low heat generation amount can be improved and the operation stability can be secured.

DESCRIPTION OF EMBODIMENTS

Figure 1:
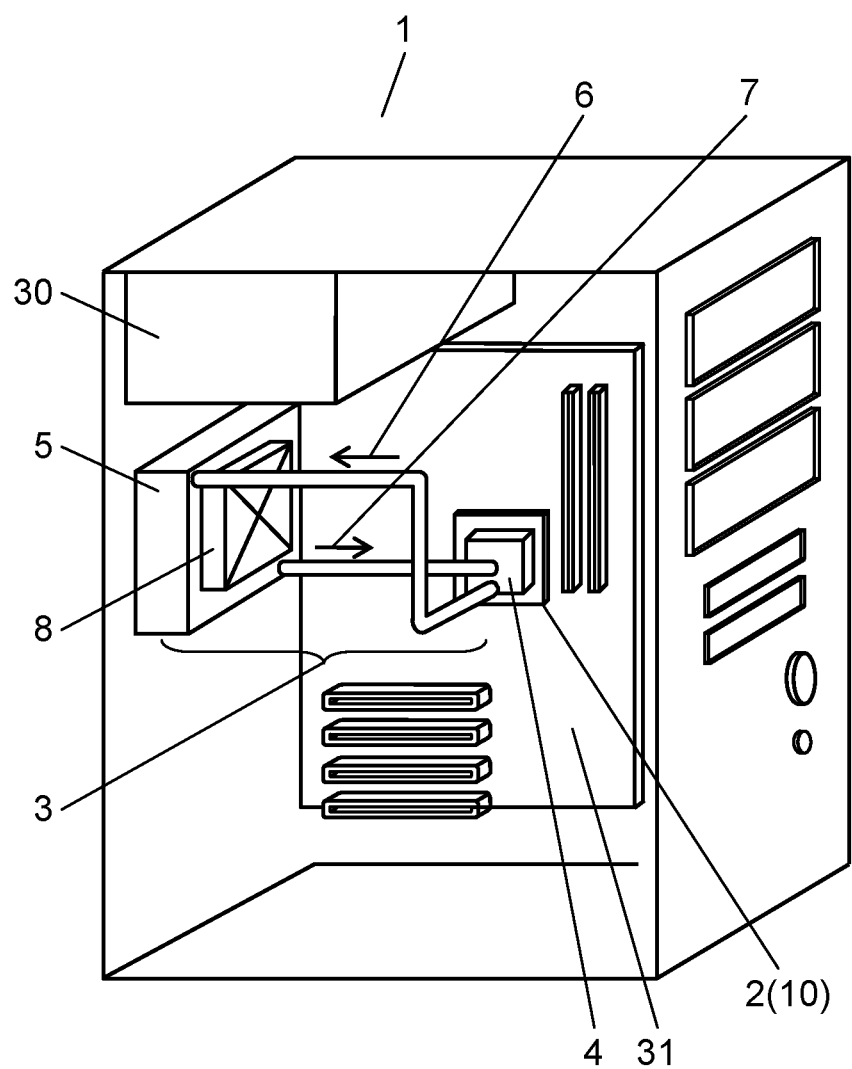
FIG. 1 is a perspective view of an electronic device including a cooling device according to Embodiment 1 of the present invention.

Hereinafter, embodiments of the present invention will be described with reference to the drawings. However, the following embodiments are exemplified to embody the technical idea of the present invention and the present invention is not limited to the following. In addition, members illustrated in claims are never specified as members of the embodiment. Particularly, the dimensions, materials, shapes, relative arrangements thereof, and the like of the constituent members described in the embodiments are not intended to limit the scope of the present invention solely unless otherwise specified and is only an example. The sizes and the positional relationship between respective members illustrated in the drawings may be exaggerated in order to clarify the explanation. Further, in the following description, the same names and reference numerals indicate the same or the equivalent members, and the detailed explanation thereof will be omitted as appropriate. Further, each element constituting the present invention may have a configuration in which a plurality of elements are constituted by the same member so that a plurality of elements are shared by a single member, or on the contrary, the function of one member can be shared and realized with a plurality of members. In addition, the contents described in some embodiments can be used for other embodiments and the like.

(Embodiment 1)

FIG. 1 is a perspective view of an electronic device including a cooling device according to Embodiment 1 of the present invention. In FIG. 1, an example in a case where cooling device 3 is disposed in a casing of an electronic device such as Personal Computer 1 (PC1) is illustrated. As illustrated in FIG. 1, PC1 includes cooling device 3 of the present invention together with PC components such as power supply unit 30 and motherboard 31.

The operation of cooling device 3 of the present invention will be described in more detail with reference to FIG. 1. On circuit board 2 disposed in the device of PC 1, electronic element 10 which is a heat generation body is mounted. In addition, in PC1, cooling device 3 is installed to cool electronic element 10 during operation. Cooling device 3 includes heat receiver 4 for transferring heat from the heat generation body to the refrigerant, heat radiator 5 connected to heat receiver 4 through heat radiation path 6, return path 7 for connecting heat receiver 4 and heat radiator 5. As illustrated in FIG. 1, heat receiver 4 is box-shaped and is in contact with electronic element 10 mounted on circuit board 2 such as a CPU board. In addition, heat radiator 5 is configured to be cooled by fan 8. Then, a circulation path is formed in which working fluid 12 (for example, water) as a refrigerant circulates in the order of heat receiver 4, heat radiation path 6, heat radiator 5, return path 7, and heat receiver 4 with gas-liquid two-phase change.

In other words, in this circulation path, working fluid 12 circulates in one direction with heat receiver 4, heat radiation path 6, heat radiator 5, return path 7, and heat receiver 4 in a state of gas (vapor) or liquid.

Next, the configuration of cooling device 3 will be described.

Figure 2:
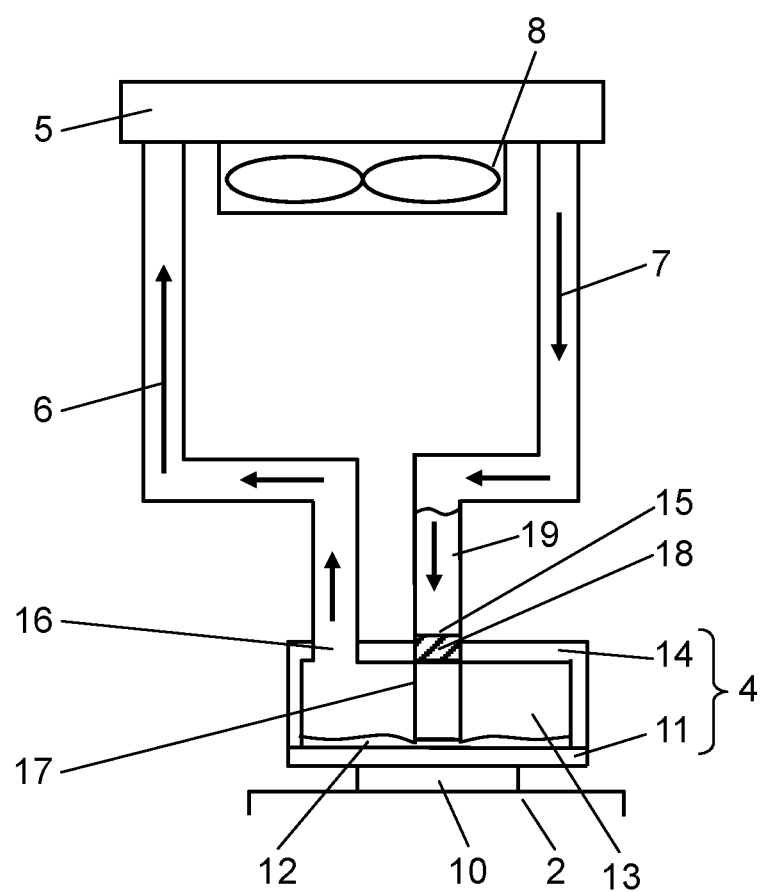
FIG. 2 is an overall configuration diagram of the cooling device.

FIG. 2 is an overall configuration diagram of the cooling device according to Embodiment 1. Cooling device 3 includes heat receiver 4, heat radiator 5, heat radiation path 6, and return path 7.

Heat receiver 4 transfers the heat of electronic element 10 which is a heat generation body to working fluid 12 which is a refrigerant. As illustrated in FIG. 2, heat receiver 4 includes heat receiving plate 11 and heat receiving plate cover 14. Heat receiving plate 11 is in contact with electronic element 10 to absorb heat. Heat receiving plate cover 14 covers the surface of heat receiving plate 11 and forms heat receiving space 13 for evaporating flowing working fluid 12. Further, heat receiving plate cover 14 is provided with inflow port 15 through which liquefied working fluid 12 flows into heat receiving space 13, and discharge port 16 for discharging working fluid 12 from heat receiving space 13 as a gas. In the present embodiment, although heat receiving plate 11 is made of copper having high thermal conductivity to improve the cooling performance, a material having high thermal conductivity other than copper may be used.

Figure 3:
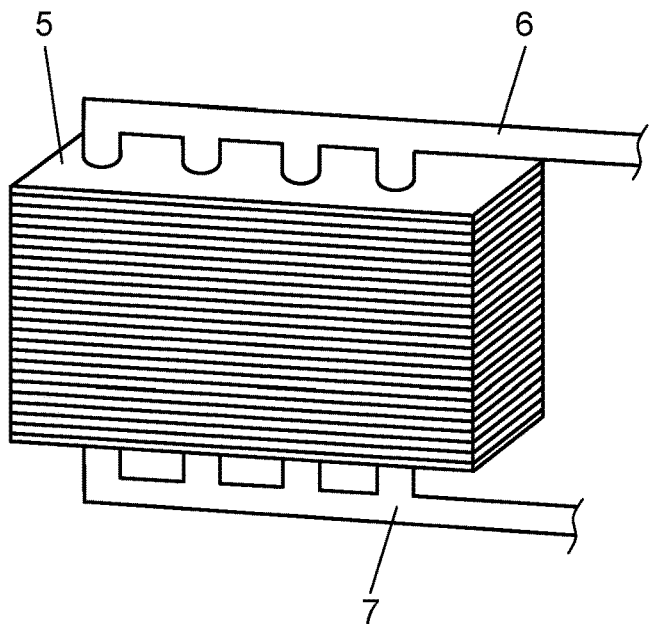
FIG. 3 is a perspective view of a heat radiator of the cooling device.

Heat radiator 5 radiates heat of working fluid 12 discharged from heat receiver 4 by sending the outside air from fan 8 to a surface of heat radiator 5. FIG. 3 is a perspective view of a heat radiator of the cooling device according to Embodiment 1. As illustrated in FIG. 3, heat radiator 5 is configured by stacking fins having aluminum thinly formed in a strip shape with a predetermined interval therebetween. In addition, heat radiation path 6 and return path 7 are connected to heat radiator 5. Then, outside air is blown from fan 8 to the surface of heat radiator 5, so that heat of working fluid 12 flowing through heat radiator 5 is radiated.

Heat radiation path 6 is connected to heat receiver 4 and heat radiator 5. Working fluid 12 by which the heat of electronic element 10 is absorbed in heat receiver 4 flows to heat radiator 5 via heat radiation path 6.

Return path 7 is connected to heat receiver 4 and heat radiator 5. Working fluid 12 whose heat is released from heat radiator 5 flows to heat receiver 4 via return path 7.

Figure 4:
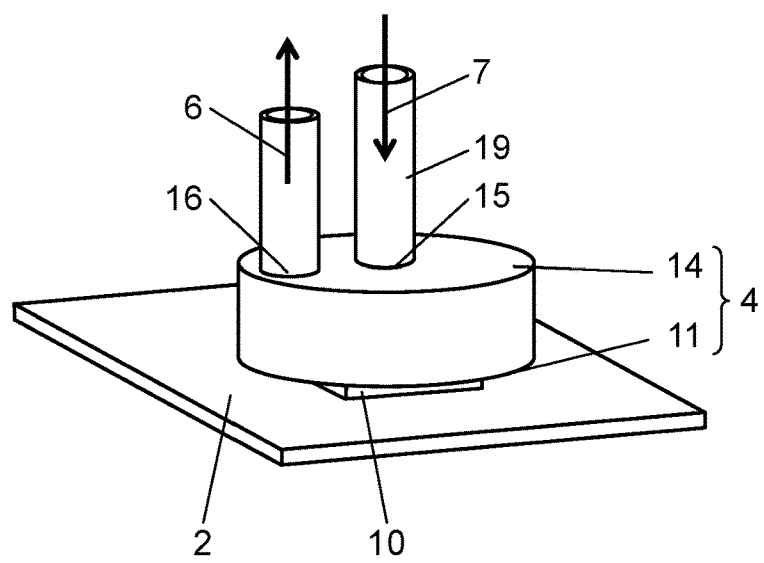
FIG. 4 is a perspective view of a heat receiver of the cooling device.
Figure 5A:
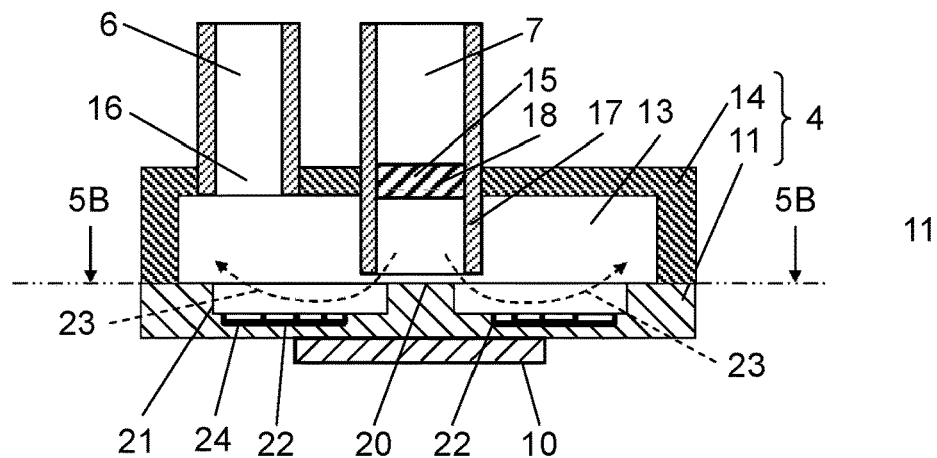
FIG. 5A is a vertical sectional view of a heat receiver of the cooling device.
Figure 5B:
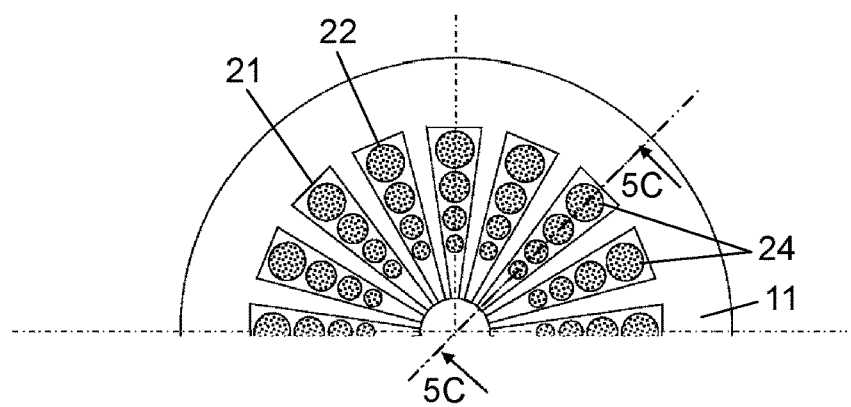
FIG. 5B is a cross-sectional view taken along line 5B-5B in FIG. 5A.
Figure 5C:
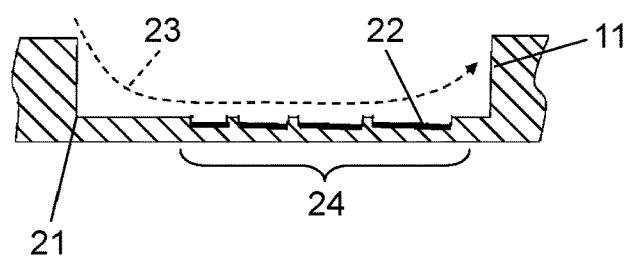
FIG. 5C is a cross-sectional view taken along line 5 C-5 C in FIG. 5B.

Next, the details of heat receiver 4 will be described. In FIG. 2, although heat receiver 4 is schematically illustrated, specifically, heat receiver 4 has a structure as illustrated in FIGS. 4, 5A, 5B, and 5C. FIG. 4 is a perspective view of a heat receiver of the cooling device according to Embodiment 1. FIG. 5A is a vertical sectional view of the heat receiver of the cooling device according to Embodiment 1. FIG. 5B is a cross-sectional view taken along line 5B-5B in FIG. 5A. FIG. 5C is a cross-sectional view taken along line 5C-5C of FIG. 5B. In other words, as illustrated in FIG. 4, inflow port 15 and discharge port 16 are provided on an upper surface of heat receiving plate cover 14. Return path 7 is connected to inflow port 15 and heat radiation path 6 is connected to discharge port 16.

Further, as illustrated in FIG. 5A, on heat receiver 4 side of return path 7, introduction pipe 17 for supplying working fluid 12 into heat receiver 4 is provided. Introduction pipe 17 is connected to heat receiver 4 side of return path 7 in a state of protruding into heat receiving space 13 of heat receiver 4. In addition, check valve 18 is provided at inflow port 15 of heat receiver 4 and the connecting portion of introduction pipe 17. Check valve 18 opens in a case where the pressure in return path 7 is larger than the pressure in heat receiving space 13. In the present embodiment, check valve 18 is opened by the water head pressure of working fluid 12 condensed and accumulated on the upper portion of check valve 18 and the pressure balance in heat receiving space 13.

In addition, as illustrated in FIGS. 5A, 5B, and 5C, in heat receiving space 13, refrigerant inflow portion 20 is provided near a center of a surface of heat receiving plate 11. In addition, radial grooves 21 are provided radially around refrigerant inflow portion 20. Then, recessed portion 24 is formed on a surface of heat receiving plate 11, that is, a bottom surface of radial groove 21 by laser processing, for example. In the present embodiment, recessed portion 24 is circular. A diameter of circular recessed portion 24 increases as circular recessed portion 24 approaches an outer edge of heat receiving plate 11. In addition, adjacent recessed portions 24 in radial grooves 21 are not communicated with each other. Hydrophilic surface treatment film 22 is formed on heat receiving plate 11, which will be described later in detail.

Next, the operation of cooling device 3 having such a configuration will be described.

In the above configuration, when an operation of electronic element 10 starts, PC1 starts to move. At this time, since a large current flows through electronic element 10, most of the power becomes heat loss and electronic element 10 generates a large amount of heat.

On the other hand, the heat transferred from electronic element 10 to heat receiving plate 11 heats liquid-phase working fluid 12 supplied onto heat receiving plate 11 of heat receiving space 13. Heated working fluid 12 generates bubbles and instantaneously vaporizes. Working fluid 12 removes a vaporization latent heat from heat receiving plate 11 during vaporization, thereby cooling heat receiving plate 11, that is, electronic element 10. Working fluid 12, which removes a vaporization latent heat from heat receiving plate 11 and is turned into the gaseous phase flows into heat radiation path 6 from discharge port 16 and is condensed in heat radiator 5 to release heat to the outside air. Here, if a bubbles generation amount from the working fluid 12 is sufficient, it can be said that the working fluid 12 sufficiently removes the heat of the heat receiving plate 11 as the vaporization latent heat, that is, the electronic element 10 can be appropriately cooled.

Working fluid 12 of which heat is released by the action of heat radiator 5 is liquefied by condensation, flows to return path 7, and accumulates on check valve 18 of inflow port 15. Liquefied working fluid 12 gradually increases in return path 7 and is again supplied from introduction pipe 17 onto heat receiving plate 11 in heat receiving space 13 when check valve 18 is pushed down by the pressure by the water head thereof.

In this manner, working fluid 12 circulates through cooling device 3 with gas-liquid two-phase change, thereby cooling electronic element 10.

Here, the mechanism of cooling in heat receiving space 13 will be further described with reference to FIGS. 5A, 5B, and 5C.

As illustrated in FIG. 5A, in heat receiving space 13, working fluid 12 from return path 7 drops as droplets onto heat receiving plate 11 via introduction pipe 17. A portion of dropped working fluid 12 is vaporized and expanded in volume to rapidly diffuse from a gap between the end portion opening of introduction pipe 17 (tip portion of introduction pipe 17) and heat receiving plate 11 to an outer peripheral portion of heat receiving plate 11. At this time, working fluid 12 is mixed phase flow 23 including a gas phase and a liquid-phase. In addition, working fluid 12 which is not vaporized drops to refrigerant inflow portion 20 provided near the center of heat receiving plate 11 and then is influenced by volume expansion of vaporized working fluid 12 and spreads as a thin film on the inner wall surface of radial grooves 21 formed radially toward the outer periphery of refrigerant inflow portion 20. Working fluid 12 spread as a thin film is evaporated instantaneously upon receipt of the heat of high heat receiving plate 11 and removes heat from heat receiving plate 11 to cool electronic element 10. By the above mechanism, cooling device 3 exerts high heat removal performance.

Although it is preferable that refrigerant inflow portion 20 is provided near the center of heat receiving plate 11 in order to facilitate the diffusion of dropped working fluid 12 along radial grooves 21, if refrigerant inflow portion 20 is inside heat receiving plate 11, even if refrigerant inflow portion 20 is not placed in the center at the center, the effect will not change if refrigerant inflow portion 20 is near the center.

However, there is an operation region unsuitable for such a cooling device. This is a case where the heat generation amount from electronic element 10 is low. In a case where the heat generation amount referred to here is low, for example, there is a case where the heat generation amount of electronic element 10 is 10 W/CM$^2$ or less. In a case where the heat generation amount of electronic element 10 is particularly low since the bubbles generation amount from working fluid 12 is extremely lowered, mixed phase flow 23 becomes relatively low and a considerable drop in the heat transfer coefficient is inevitable. In other words, in a case where the heat generation amount of electronic element 10 is low since the initial evaporation amount of working fluid 12 dropped into heat receiving space 13 is reduced, the volume expansion rate of gas phase working fluid 12 becomes slow. The initial evaporation amount referred to here is the amount that evaporates when liquid-phase working fluid 12 is dropped into heat receiving space 13. In heat receiving space 13, working fluid 12 becomes mixed phase flow 23 of a gas phase and a liquid-phase and liquid-phase working fluid 12 spreads on the inner wall surface of radial groove 21 with the volume expansion of gas-phase working fluid 12. When the heat generation amount of electronic element 10 is sufficient, since the volume expansion speed of gas-phase working fluid 12 is high, liquid-phase working fluid 12 spreads quickly and thinly on the inner wall surface of radial groove 21. Therefore, sufficient bubbles are generated from liquid-phase working fluid 12 and liquid-phase working fluid 12 is quickly vaporized. However, in a case where the heat generation amount by electronic element 10 is low since the volume expansion rate of gas-phase working fluid 12 becomes slow, liquid-phase working fluid 12 does not spread thinly. As a result, sufficient bubbles are not generated from liquid-phase working fluid 12 and the vaporization rate is also slow. A slow evaporation rate of liquid-phase working fluid 12 means a decrease in the heat transfer coefficient between electronic element 10 and heat receiving plate 11. Therefore, in the present embodiment, hydrophilic surface treatment film 22 is formed on heat receiving plate 11 by the laser processing described above. Specifically, as illustrated in FIGS. 5A, 5B, and 5C, surface treatment film 22 is formed in recessed portion 24 provided on the bottom surface of radially arranged radial grooves 21. In other words, surface treatment film 22 is formed in recessed portion 24 provided on the surface of heat receiving plate 11.

By forming surface treatment film 22 in recessed portion 24 provided on the bottom surface of radial groove 21 which is the boiling surface of working fluid 12, liquid-phase working fluid 12 spreads thinly on radial groove 21 even at a low heat generation amount, the bubble generation is promoted and a large bubble generation amount can be secured even at a low heat generation amount. Accordingly, even in a case where the heat generation amount by electronic element 10 is low, working fluid 12 having a sufficient gas phase can be obtained. Therefore, cooling device 3 can generate high-speed mixed phase flow 23, and high cooling performance can be maintained. In addition, in the present embodiment, surface treatment film 22 is not formed on the bottom surface of heat receiving plate 11 which is a flat surface but is formed in recessed portion 24 provided on the bottom surface of heat receiving plate 11. Accordingly, it is possible to structurally prevent surface treatment film 22 formed in recessed portion 24 from being damaged by some physical contact. Details thereof are described below.

Next, the effect of forming surface treatment film 22 in recessed portion 24 will be described.

Usually, working fluid 12 in the device or enclosed in the device often contains some fine foreign matter (contamination). In addition, the surface treatment film 22 is a very thin film. In the heat receiving space 13, the working fluid 12 flows at high-speed as the mixed phase flow 23.

Here, a case where surface treatment film 22 is formed on heat receiving plate 11 without radial grooves 21 and recessed portions 24 is considered. In this case, surface treatment film 22 is exposed to heat receiving plate 11. Therefore, in a case where the mixed phase flow 23 containing foreign matter flows near surface treatment film 22, mixed phase flow 23 can be easily in contact with surface treatment film 22. Therefore, there is a risk that surface treatment film 22 is damaged by mixed phase flow 23 containing the foreign matter and is peeled off.

On the other hand, a case where surface treatment film 22 is formed in recessed portion 24 provided on the bottom surface of radial groove 21 of heat receiving plate 11 is considered. In this case, surface treatment film 22 is not exposed to heat receiving plate 11. Therefore, in a case where mixed phase flow 23 containing foreign matter flows near surface treatment film 22, mixed phase flow 23 cannot be simply in contact with surface treatment film 22. Therefore, the risk that surface treatment film 22 is damaged by mixed phase flow 23 containing foreign matter and peeled off is reduced. In addition, as illustrated in FIG. 5C, adjacent recessed portions 24 to each other in radial grooves 21 are separated by heat receiving plate 11 and are not in communication with each other. Therefore, heat receiving plate 11 can structurally prevent surface treatment film 22 from being damaged.

According to this structure, since cooling device 3 can prevent surface treatment film 22 formed on heat receiving plate 11 from being damaged, even in a case where the heat generation amount by electronic element 10 is small, long-term operational stability can be secured in addition to appropriate cooling of the electronic device.

In the above description, a case where surface treatment film 22 is formed only in recessed portion 24 is described, but the present invention is not limited to this. For example, surface treatment film 22 may be formed on the entire bottom surface of radial groove 21 including recessed portion 24. This will be explained additionally with reference to FIGS. 6A, 6B, 6C, and 6D.

Figure 6A:
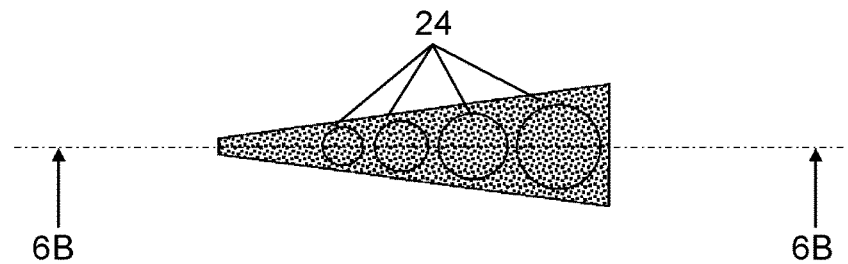
FIG. 6A is a plan view of the bottom portion of a radial groove of the cooling device.
Figure 6B:
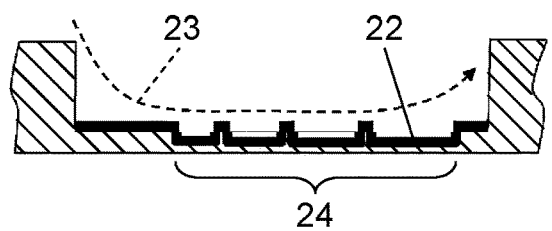
FIG. 6B is a cross-sectional view taken along the line 6B-6B in FIG. 6A.
Figure 6C:
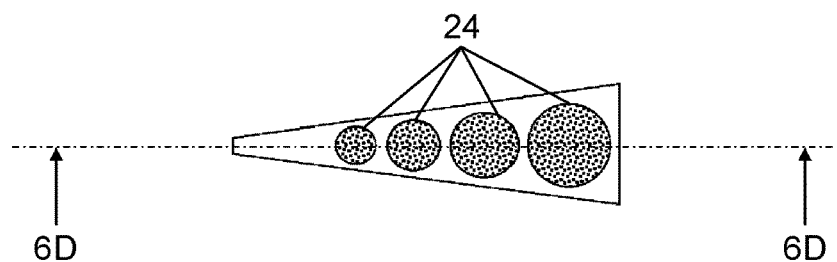
FIG. 6C is a plan view in a case where damage to the surface treatment film formed at the bottom portion of the radial groove of the cooling device progresses.
Figure 6D:
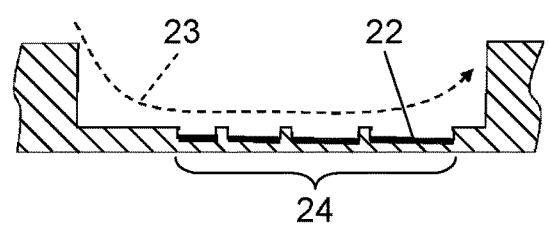
FIG. 6D is a cross-sectional view taken along the line 6D-6D in FIG. 6C.

FIG. 6A is a plan view of the bottom portion of the radial groove of the cooling device according to Embodiment 1. FIG. 6B is a cross-sectional view taken along line 6B-6B in FIG. 6A. FIG. 6C is a plan view in a case where damage to the surface treatment film formed at the bottom portion of the radial groove of the cooling device according to Embodiment 1 progresses. FIG. 6D is a cross-sectional view taken along line 6D-6D in FIG. 6C. Normally, as illustrated in FIGS. 6A and 6B, surface treatment film 22 is present on the entire bottom surface of radial groove 21 including recessed portion 24 at the initial stage of the formation of surface treatment film 22. However, in a state where a fine foreign matter is mixed in working fluid 12, in a case where high-speed mixed phase flow 23 containing foreign matter flows over surface treatment film 22 on the bottom surface, as illustrated in FIGS. 6C and 6D, only surface treatment film 22 near the surface to which mixed phase flow 23 directly hits is damaged and peels off. On the other hand, there is a high possibility that surface treatment film 22 formed in recessed portion 24, which is unlikely to directly hit mixed phase flow 23, can remain without being damaged. By forming surface treatment film 22 in recessed portion 24 provided on the bottom surface of radial groove 21 in this manner, it is possible to prevent surface treatment film 22 from being damaged and secure a high cooling performance over a long period even at a low heat generation amount.

Figure 7A:
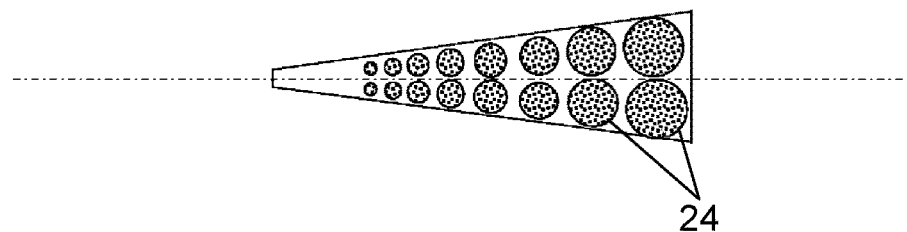
FIG. 7A is a diagram illustrating a shape of another recessed portion at the bottom portion of the radial groove of the cooling device and illustrating a shape of a recessed portion of a double circular row.
Figure 7B:
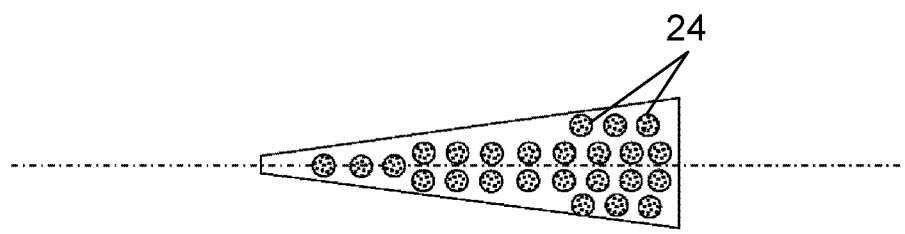
FIG. 7B is a diagram illustrating a shape of a recessed portion of a micro circle.
Figure 7C:
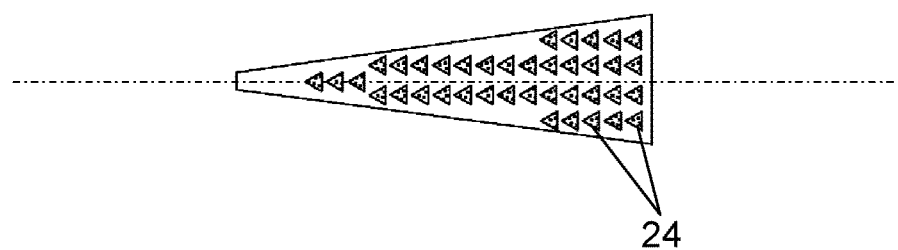
FIG. 7C is a diagram illustrating a shape of a recessed portion of a micro triangle.
Figure 7D:
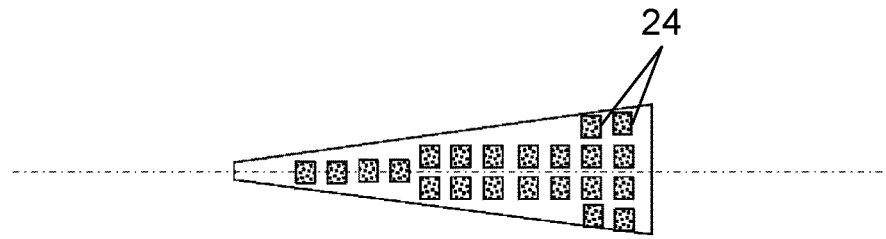
FIG. 7D is a diagram illustrating a shape of a recessed portion of a micro rectangle.

In the present embodiment, the shape of recessed portion 24 is circular. In addition, although the diameter of circular recessed portion 24 is configured to increase as approaching the outer edge of heat receiving plate 11, the present invention is not limited to this. FIG. 7A to FIG. 7D are diagrams illustrating modification examples of the shape of the recessed portion in the cooling device according to Embodiment 1. FIG. 7A is a diagram illustrating the shape of a recessed portion of a double circle series. FIG. 7B is a view illustrating the shape of a recessed portion of a micro circle. FIG. 7C is a diagram illustrating the shape of a recessed portion of a micro triangle. FIG. 7D is a view illustrating the shape of a recessed portion of a micro rectangle. In other words, the shape of recessed portion 24 may be polygonal. Regarding the prevention of damage to surface treatment film 22, the same effect can be obtained in these cases.

(Embodiment 2)

Next, cooling device 3 according to Embodiment 2 will be described. The same reference numerals are given to the same constituent elements as those in Embodiment 1, and a detailed description thereof will be omitted.

Figure 8A:
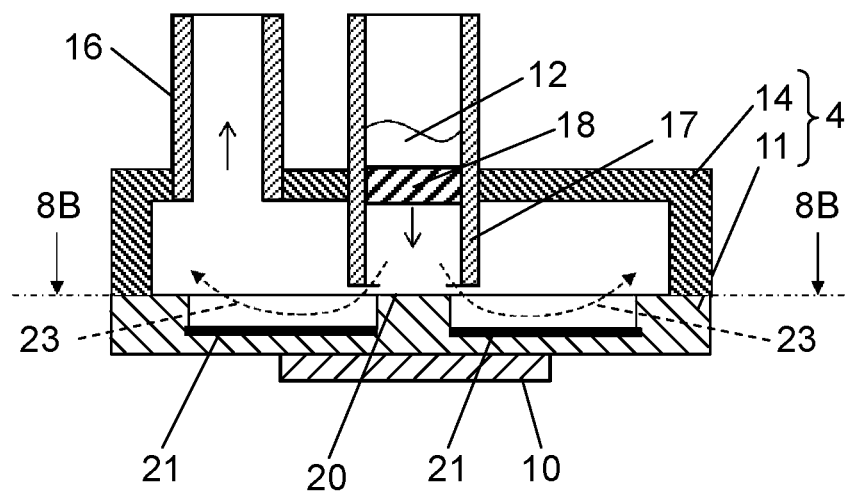
FIG. 8A is a vertical sectional view of a heat receiver of a cooling device according to Embodiment 2 of the present invention.
Figure 8B:
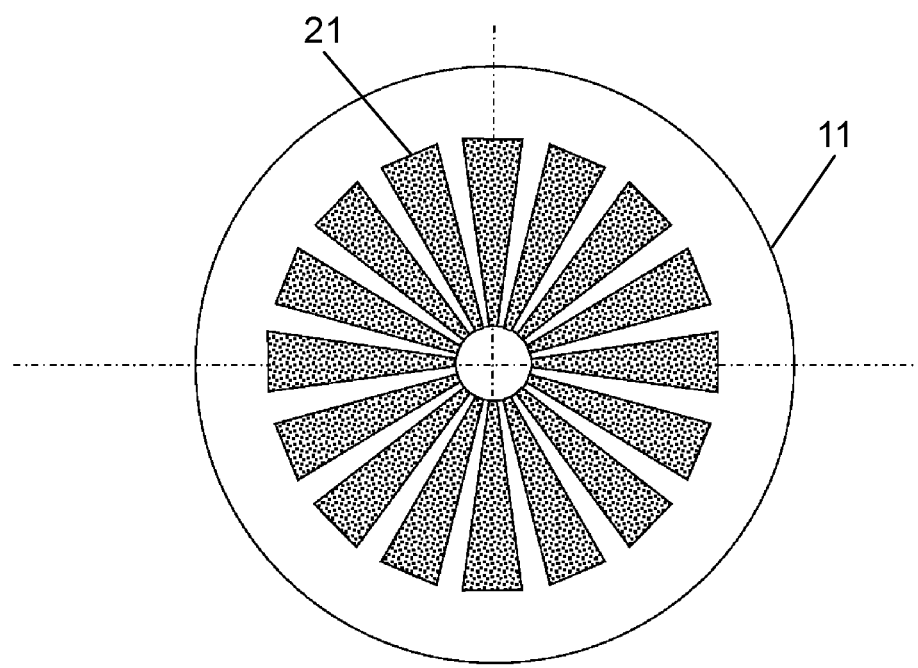
FIG. 8B is a cross-sectional view taken along line 8B-8B in FIG. 8A.

FIG. 8A is a vertical sectional view of the heat receiver of the cooling device according to Embodiment 2. FIG. 8B is a cross-sectional view taken along line 8B-8B in FIG. 8A. Since the respective constituent elements constituting cooling device 3 according to Embodiment 2 illustrated in FIGS. 8A and 8B are substantially the same except for recessed portion 224a, the explanation will be omitted.

Figure 9A:
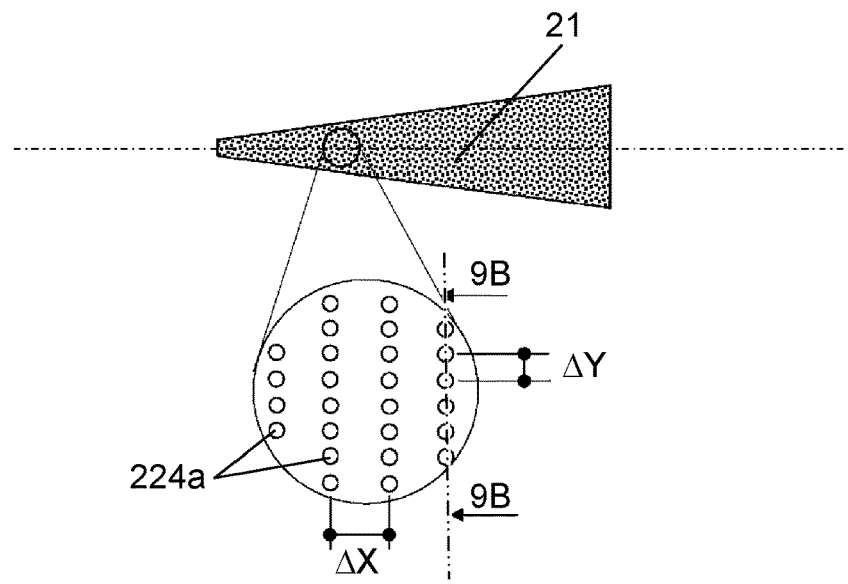
FIG. 9A is a partially enlarged view of the bottom surface of the radial groove of the cooling device.
Figure 9B:
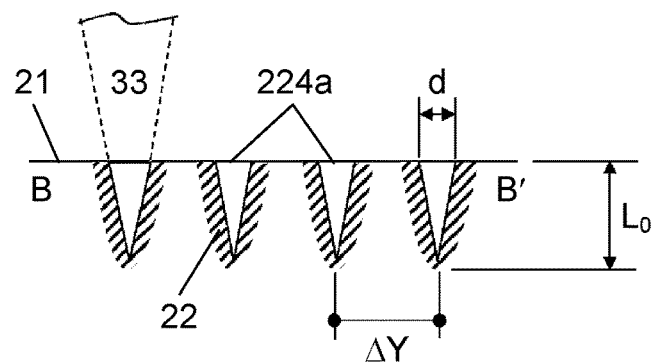
FIG. 9B is a cross-sectional view taken along the line 9B-9B in FIG. 9A.

FIG. 9A is a partially enlarged view of the bottom surface of the radial groove of the cooling device according to Embodiment 2. FIG. 9B is a cross-sectional view taken along line 9B-9B in FIG. 9A. As illustrated in FIG. 9A, recessed portion 224a is provided at a predetermined distance on the bottom surface of radial groove 21 provided in heat receiving plate 11. In the present embodiment, recessed portion 224a is formed with a ΔY interval in the up and down direction and a ΔX interval in the left and right direction, for example, by laser light 33. In other words, recessed portions 224a have a configuration in which a plurality of recessed portion rows including a plurality of recessed portions 224a disposed in a row at a predetermined interval are disposed in parallel. By thus forming the plurality of recessed portions 224a on the bottom surface of radial groove 21, since the generation point of bubbles is increased, the generation of bubbles is promoted. Therefore, a large amount of bubble generation can be secured even at a low heat generation amount. Therefore, high-speed mixed phase flow 23 can be secured, and high cooling performance can be maintained.

In addition, in the present embodiment, a plurality of rows of the plurality of recessed portions 224a arranged in a line at a uniform predetermined interval is arranged in parallel on the bottom surface of radial groove 21 of heat receiving plate 11. According to this configuration, there are effects that generation of uniform bubbles can be promoted on the surface of heat receiving plate 11 and variations in the temperature of working fluid 12 on the surface of heat receiving plate 11 can be reduced.

FIG. 9B is a cross-sectional view taken along the line 9B-9B in FIG. 9A. As illustrated in FIG. 9B, hydrophilic surface treatment film 22 is formed in recessed portion 224a. Since the effect of surface treatment film 22 is already described in Embodiment 1, the explanation will be omitted. In addition, surface treatment film 22 is formed on the entire bottom surface of radial groove 21 including recessed portion 224a as in Embodiment 1. According to this configuration, since surface treatment film 22 formed in recessed portion 224a is separated by heat receiving plate 11, it is possible to structurally prevent surface treatment film 22 from being damaged by some physical contact.

Recessed portion 224a illustrated in FIG. 9B has a conical shape and can be formed using laser light 33. For example, by irradiating with laser light 33 for about 5 ms to 10 ms, recessed portion 224a having an inlet diameter d of about 80 μm to 100 μm and depth $L_0$ of about 130 μm to 150 μm can be formed. Also in this embodiment, an example in a case of using a copper heat receiving plate 11 is illustrated.

As illustrated in FIG. 9B, the sectional shape of conical recessed portion 224a is formed in a conical shape whose apex forms an acute angle. Since recessed portion 224a having a conical shape has a conical shape whose apex forms an acute angle, the volume near the apex of the cone is small. Therefore, since working fluid 12 having a small volume near the apex of the cone receives heat from the heat generation body, working fluid 12 flowing into recessed portion 224a can promote bubble generation of the working fluid even at a low temperature.

Figure 9C:
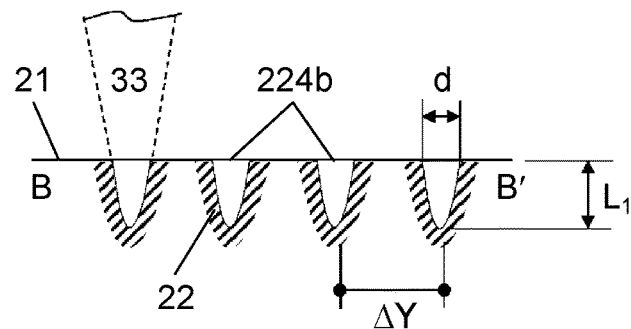
FIG. 9C is a view for explaining a modification example of the recessed portion of the cooling device.

In the present embodiment, although a case where recessed portion 224a has a conical shape is described, the present invention is not limited thereto. With reference to FIG. 9C, a case where recessed portion 224a is other than a conical shape will be described.

FIG. 9C is a diagram for explaining a modification example of the recessed portion of the cooling device according to Embodiment 2. As illustrated in FIG. 9C, recessed portion 224b has a bullet shape. The bullet shape can be formed by shortening the irradiation time with laser light 33. By way of example, by irradiating with the laser light 33 for about 3 ms to 5 ms, bullet-shaped recessed portion 224b having inlet diameter d of about 80 μm to 100 μm and depth $L_1$ of about 100 μm to 130 μm can be formed. In the present embodiment, bullet-shaped recessed portion 224b having machining depth $L_1$ shallower than the focal depth is formed. The configuration of bullet-shaped recessed portion 224b of FIG. 6C has a shape of the deepest portion of the recessed portion which slightly differs from the configuration of conical recessed portion 224a of FIG. 9B. However, as in a case of conical recessed portion 224a illustrated in FIG. 9B, since the volume near the tip of bullet-shaped recessed portion 224b is small, even when the heat received from the heat generation body is low temperature, bubble generation of working fluid 12 can be promoted. In addition, the laser processing time can be shortened by making the depth of the recessed portion shallow while maintaining the same bubble generation effect.

Also, in this case, surface treatment film 22 is formed on the entire bottom surface of radial groove 21 including recessed portion 224b. For this reason, the bubble generation effect can be maintained while preventing the physical damage of surface treatment film 22 and high cooling performance can be secured over a long period even at a low heat generation amount.

INDUSTRIAL APPLICABILITY

The cooling device according to the present invention can stably realize a high cooling effect in a wide operation range ranging from a low heat generation amount to a high heat generation amount.

For this reason, it is useful for cooling electronic elements such as CPUs and power semiconductors, in which the heat generation amount greatly changes from low power to high power.

REFERENCE MARKS IN THE DRAWINGS

1 PC
2 CIRCUIT BOARD
3 COOLING DEVICE
4 HEAT RECEIVER
5 HEAT RADIATION PORTION
6 HEAT RADIATION PATH
7 RETURN PATH
8 FAN
10 ELECTRONIC ELEMENT
11 HEAT RECEIVING PLATE
12 WORKING FLUID
13 HEAT RECEIVING SPACE
14 HEAT RECEIVING PLATE COVER
15 INFLOW PORT
16 DISCHARGE PORT
17 INTRODUCTION PIPE
18 CHECK VALVE
20 REFRIGERANT INFLOW PORTION
21 RADIAL GROOVE
22 SURFACE TREATMENT FILM
23 MIXED PHASE FLOW
24, 224a, 224b RECESSED PORTION
30 POWER SUPPLY UNIT
31 MOTHERBOARD

The invention claimed is:

1. A cooling device comprising:
a heat receiver configured to transfer heat from a heat generation body to a refrigerant;
a heat radiator that is connected to the heat receiver via a heat radiation path; and
a return path that connects the heat radiator and the heat receiver with each other,
wherein the refrigerant is to circulate in order of the heat receiver, the heat radiation path, the heat radiator, and the return path and cause a gas-liquid two-phase change and cool the heat generation body,
wherein the heat receiver includes:
a heat receiving plate which is in contact with the heat generation body and is configured to absorb the heat, and
a heat receiving cover which covers a surface of the heat receiving plate and defines a heat receiving space,
wherein a check valve that is configured to open in a case where pressure of the return path is larger than pressure in the heat receiving space is between the return path and the heat receiver,
wherein at least one groove is defined in the surface of the heat receiving plate and at least one recessed portion is defined in a bottom surface of the at least one groove, and
wherein a hydrophilic surface treatment film is on the at least one recessed portion.

2. The cooling device according to claim 1,
wherein, in the heat receiving space, the heat receiver includes a refrigerant inflow portion from which the refrigerant is to flow into the heat receiving space, the refrigerant inflow portion being adjacent to a center of the heat receiving plate, and
wherein the at least one groove comprises a plurality of grooves radially extending from the refrigerant inflow portion.

3. The cooling device according to claim 1,
wherein the at least one recessed portion has a circular shape or a polygonal shape.

4. The cooling device according to claim 1,
wherein the at least one recessed portion comprises a plurality of recessed portions arranged in a row at predetermined intervals, and
wherein the row is one of a plurality of rows arranged in parallel.

5. The cooling device according to claim 1,
wherein an inner wall surface of the at least one recessed portion has a conical shape or a bullet shape.

6. An electronic device comprising:
the cooling device according to claim 1.

* * * * *